United States Patent
Chang et al.

(10) Patent No.: US 6,608,361 B2
(45) Date of Patent: Aug. 19, 2003

(54) ON-CHIP INDUCTOR USING ACTIVE MAGNETIC ENERGY RECOVERY

(75) Inventors: Mau-Chung F. Chang, Los Angeles, CA (US); Yi-Cheng Wu, West Los Angeles, CA (US)

(73) Assignee: G-Plus, Inc., Santa Monica, CA (US)

(*) Notice: Subject to any disclaimer, the term of this patent is extended or adjusted under 35 U.S.C. 154(b) by 8 days.

(21) Appl. No.: 09/999,709

(22) Filed: Oct. 30, 2001

(65) Prior Publication Data

US 2003/0080846 A1 May 1, 2003

Related U.S. Application Data

(60) Provisional application No. 60/309,150, filed on Jul. 31, 2001.

(51) Int. Cl.[7] .............................................. H01L 29/00
(52) U.S. Cl. ..................... 257/499; 336/200; 336/223; 257/528
(58) Field of Search ............................... 257/499, 528, 257/531, 532; 336/200, 223, 232

(56) References Cited

U.S. PATENT DOCUMENTS

| | | | |
|---|---|---|---|
| 5,883,335 A | * 3/1999 | Mizumoto et al. ........... | 174/266 |
| 5,994,985 A | 11/1999 | Pehlke et al. .................. | 334/14 |
| 6,002,161 A | * 12/1999 | Yamazaki .................... | 257/531 |
| 6,258,688 B1 | * 7/2001 | Tsai ............................ | 438/381 |
| 6,287,937 B1 | * 9/2001 | Lee et al. .................... | 438/424 |
| 6,504,227 B1 | * 1/2003 | Matsuo et al. .............. | 257/531 |

* cited by examiner

Primary Examiner—Anh Mai
(74) Attorney, Agent, or Firm—Koppel, Jacobs, Patrick & Heybl

(57) ABSTRACT

An active inductor circuit includes a primary and a secondary coil and a drive circuit monolithically integrated on a common substrate to provide high-Q inductors. Each inductor circuit comprises a primary coil which carries a first current that varies with an RF input signal, and a secondary coil which carries a second current that varies with the RF input; an on-chip current source provides the second current. The inductor circuit is arranged such that there is a fixed phase difference of approximately 90° between the first and second currents, and such that the magnetic field induced by the second current compensates for energy that would otherwise be dissipated by the primary coil. When the second current is properly selected, the inductor circuit's input impedance is made purely imaginary, such that the circuit emulates an ideal inductor at a particular frequency.

28 Claims, 7 Drawing Sheets

Freq=1.838GHz
Impedance=0.12+j73.12
Equivalent Inductance=6.33nH

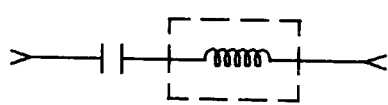
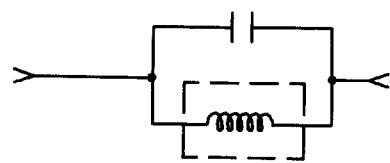
FIG.8a  FIG.8b
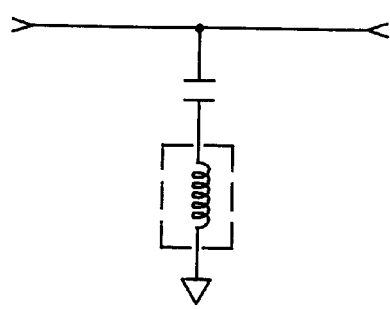
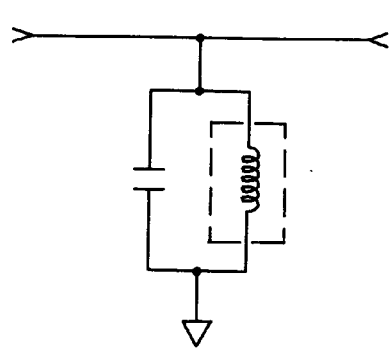
FIG.8c  FIG.8d
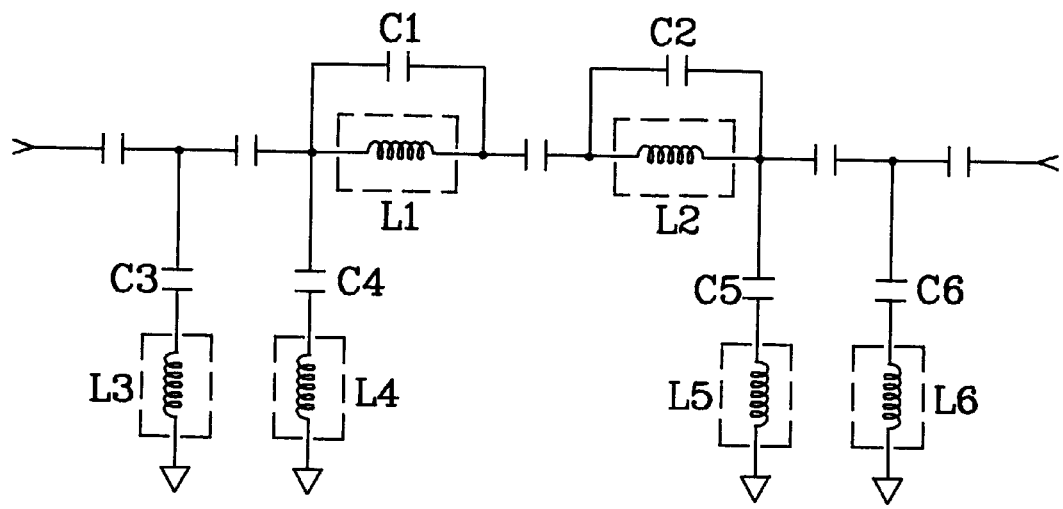
FIG.10

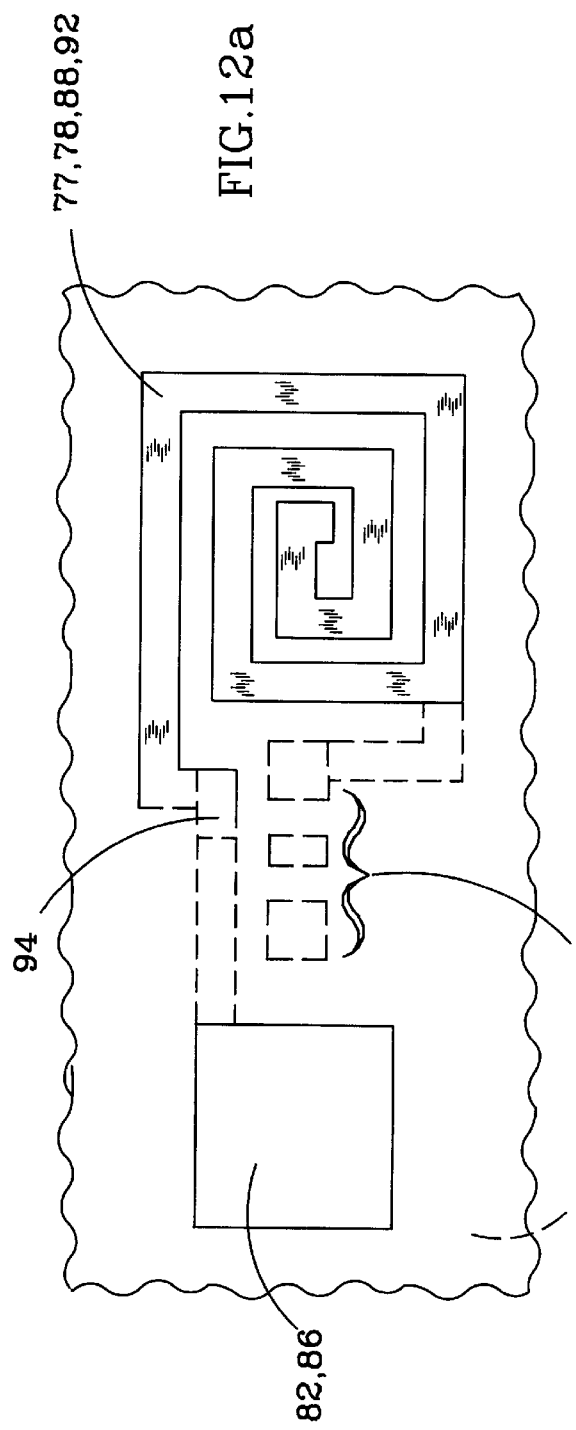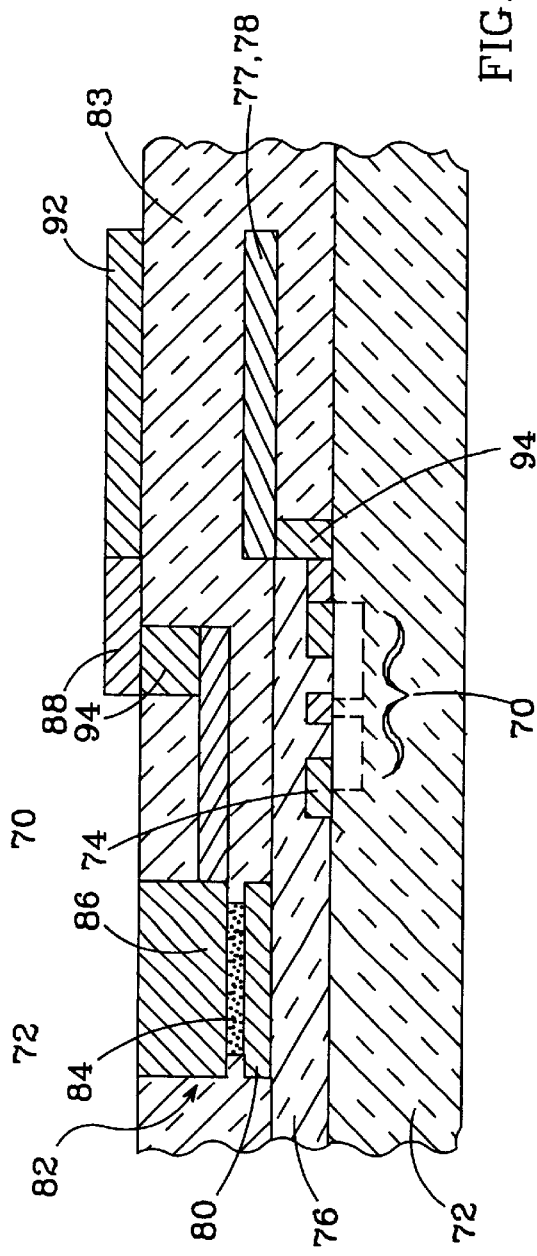

ON-CHIP INDUCTOR USING ACTIVE MAGNETIC ENERGY RECOVERY

This application claims the benefit of provisional patent application No. 60/309,150 to Chang et al., filed Jul. 31, 2001.

BACKGROUND OF THE INVENTION

1. Field of the Invention

This invention relates to the field of integrated inductors, and particularly to monolithic high-Q transformer-type active inductors.

2. Description of the Related Art

Many analog circuit designs, such as fully integrated RF transceivers, require high performance reactive components—particularly inductors. It is often desirable for inductors in RF transceivers to be very low loss, with a resulting high quality factor (Q). For instance, high-Q tank circuits in voltage-controlled oscillators (VCOs) reduce phase noise. High-Q inductors in low noise amplifiers (LNAs) and power amplifiers (PAs) reduce noise, and improve gain, efficiency and input/output matching.

Bandpass filters and resonators crucial to many multi-function communication systems are commonly made of off-chip inductors and capacitors based on SAW or ceramic technologies, which are expensive, bulky, complex in assembly and problematic in reliability. In the past, the integration of these filters or resonators with CMOS components was as regarded impossible, due to the lack of integratable high-Q inductors to meet system needs in insertion loss, linearity and switching speed.

One approach to these problems is discussed in U.S. Pat. No. 5,994,985 to Pehlke et al. There, two coils are driven with respective currents to provide an active inductor. The design requires the use of a variable gain amplifier, a variable phase shifter, and a directional coupler. However, the circuit described in Pehlke et al. has a number of deficiencies. The directional coupler, for example, is too large to be practically integrated. With the coupler off-chip, a hybrid circuit implementation is required, which tends to be more costly and unreliable than a monolithic design; a hybrid implementation also suffers from higher power consumption and noise, has limited linearity, and requires a larger area.

Furthermore, the variable phase shifter itself often requires high-Q inductors to facilitate phase tuning. Also, the cited patent describes only a one-terminal (grounded) active inductor, which is inadequate in many circuit designs.

SUMMARY OF THE INVENTION

A monolithic active inductor circuit is presented which overcomes the problems noted above. Each inductor circuit includes a primary and a secondary coil and a drive circuit, all of which are monolithically integrated on a common substrate to provide a high-Q value; the resulting inductor can in turn be used to provide high performance on-chip resonators and filters.

Each monolithic active inductor circuit comprises an input terminal which receives an RF input signal, a primary coil which carries a first current that includes an AC component which varies with the RF input signal, and a secondary coil which carries a second current that also includes an AC component which varies with the input signal. The primary and secondary coils are located in close proximity to each other such that a magnetic field induced by a current in the secondary coil is coupled to the primary coil.

The active inductor circuit also includes an on-chip current source which provides the second current in the secondary coil. The inductor circuit is arranged such that there is a fixed phase difference of approximately 90° between the AC components of the first and second currents and such that the magnetic field induced by the second current compensates for energy that would otherwise be dissipated by the primary coil. When the second current is properly selected, the inductor circuit's input impedance is made purely imaginary, and the circuit emulates an ideal inductor at a particular frequency.

The on-chip current source preferably comprises a single transistor or a current mirror circuit, preferably CMOS, and the fixed phase difference is preferably achieved with an on-chip capacitor. When so arranged, the inductor coils and current source are easily fabricated on a common substrate, with the current source circuit preferably using CMOS components.

The present active inductor circuit can be combined with on-chip capacitors to form fully integrated high performance resonators and filters, using well-known and cost-effective fabrication techniques.

Further features and advantages of the invention will be apparent to those skilled in the art from the following detailed description, taken together with the accompanying drawings.

BRIEF DESCRIPTION OF THE DRAWINGS

FIGS. 8a–8d are schematic diagrams of four possible resonator configurations, each employing an active inductor circuit per the present invention.

FIG. 10 is a schematic diagram of an exemplary bandpass filter which employs active inductor circuits per the present invention.

FIG. 12a is a plan view of an on-chip active inductor circuit per the present invention.

FIG. 12b is a sectional view of an on-chip active inductor circuit which corresponds to the plan view of FIG. 12a.

DETAILED DESCRIPTION OF THE INVENTION

Figure 1:
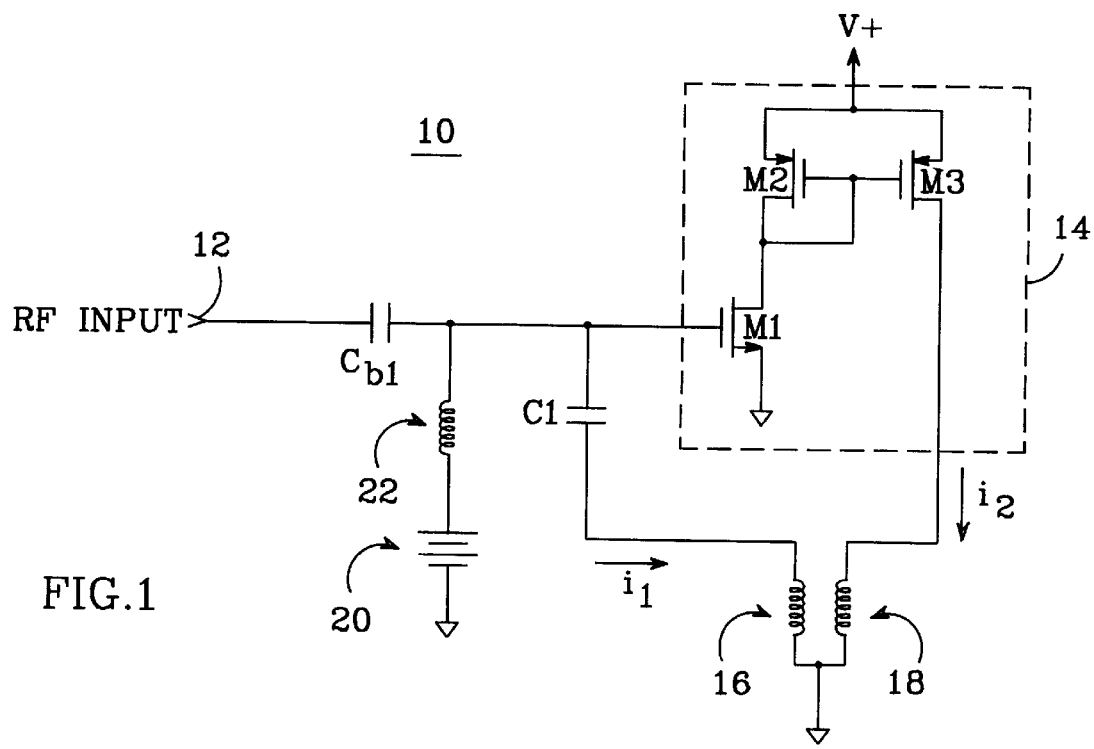
FIG. 1 is a schematic diagram of an active inductor circuit per the present invention.

A schematic diagram of one possible embodiment of a monolithic active inductor circuit 10 per the present invention is shown in FIG. 1. An RF input signal is applied at an input terminal 12, and is AC-coupled via a DC-blocking capacitor $C_{b1}$ to a capacitor C1 and a current source 14. A primary coil 16 is connected to the other side of C1 and receives a current $i_1$, and a secondary coil 18 is connected to receive the output $i_2$ of current source 14. The active inductor is a transformer-type, with the primary and secondary coils located in close proximity to each other such that a magnetic field induced by a current in the secondary coil is coupled to the primary coil.

Capacitor C1 acts to introduce a fixed phase shift of approximately 90° into the RF input signal applied to the primary coil ($i_1$), and current source 14 acts to adjust the amplitude of current $i_2$ with respect to current $i_1$. When implemented as shown in FIG. 1, the output $i_2$ of current source 14 is inverted by approximately 180° with respect to its drive signal. The 180° due to the current source and the 90° due to C1 results in a fixed phase difference of approximately 90° between the AC components of currents $i_1$ and $i_2$.

Instead of using a directional coupler as in the prior art, a simple capacitor (C1) is used for coupling power between primary coil 16 and secondary coil 18, with the current flowing in the secondary coil adjusted via current source 14. Current source 14 is preferably implemented as a three-transistor current mirror as shown in FIG. 1: a first transistor M1 receives the AC-coupled RF input signal at its gate and conducts a current in response, which is mirrored by transistors M2 and M3 to provide current $i_2$ to secondary coil 18. When so arranged, the ratio of current $i_2$ to current $i_1$ can be adjusted by properly selecting the sizes of the current mirror transistors, which are preferably MOS devices as shown in FIG. 1.

With the sizes of the mirror transistors known, the total current (AC+DC components) $I_2$ in secondary coil 18 can be approximated as:

$$I_2 = \frac{1}{2}\mu_n C_{OX}(V_{GS1} - V_{T,n})^2 \left(\frac{W}{L}\right)_1 \frac{\left(\frac{W}{L}\right)_3}{\left(\frac{W}{L}\right)_2} \quad (\text{Eq. 1})$$

where $\mu_n$ is the electron mobility in secondary coil 18, $C_{OX}$ is the oxide capacitance of coil 18, $V_{GS1}$ is M1's gate-to-source voltage, $V_{T,n}$ is the NMOS threshold voltage, and $(W/L)_1$, $(W/L)_2$ and $(W/L)_3$ are the width-to-length ratios for M1, M2 and M3, respectively. If the length of each MOS is made equal, Eq. 1 can be further simplified, with the transconductance of current source 14 given by:

$$\frac{i_2}{v_1} = \frac{\partial I_2}{\partial V_{GS1}} = \mu_n C_{OX}(V_{GS1} - V_{T,n}) \times \left(\frac{W}{L}\right)_1 \times \frac{(W)_3}{(W)_2} = \frac{g_{m1}g_{m3}}{g_{m2}} \quad (\text{Eq. 2})$$

where $v_1$ is the voltage across primary coil 16. On the primary side, the input voltage and current relationship is restated here as:

$$v_1 = i_1 \cdot R_1 + j\omega L_1 \cdot i_1 + j\omega M \cdot i_2 \quad (\text{Eq. 3})$$

where $R_1$ and $L_1$ are the effective resistance and self-inductance, respectively, of primary coil 16, and M is the mutual inductance between coils 16 and 18 and is given by $$M = k \cdot \sqrt{L_1 \cdot L_2}$$

where $L_2$ is the effective self-inductance of coil 18 and k is the coupling coefficient.

Substituting (Eq. 2) into (Eq. 3), the input impedance $Z_{in}$ of inductor circuit 10 can be determined. To approximate an ideal inductor, the real part of the input impedance is set to zero, and thus the condition for a very high-Q inductor is given by:

$$\frac{g_{m1}g_{m3}}{g_{m2}} = \frac{R_1}{\omega^2 L_1 M} \quad (\text{Eq. 4})$$

This enables the current ratio $i_2/i_1$ to be defined as:

$$\frac{i_2}{i_1} \approx \frac{R_1 + jwL_1}{(g_{m2}/g_{m1}g_{m3}) - j\omega M} = j\frac{R_1}{\omega M} \quad (\text{Eq. 5})$$

Eq. 5 shows that there must be a phase difference of 90° between $i_1$ and i2 to achieve a very high-Q. The input impedance $Z_{in}$ at RF input terminal 12 is given by:

$$Z_{in} = R_{eff} + j\omega L_{eff}$$

However, by properly selecting $i_2/i_1$, the real part of $Z_{in}$ can be canceled such that $Z_{in}$ is given by:

$$Z_{in} \approx jwL_{eff} \quad (\text{Eq. 6})$$

For purposes of determining the device parameters found in Eqs. 2 and 4, an ideal phase difference of 90° may be assumed to exist between $i_1$ and $i_2$. This value is only a first order approximation, however, and may not be attainable in an actual device. This is because second-order effects such as stray and parasitic capacitance in the active inductor circuit can cause the phase difference to deviate from the ideal 90°, with the magnitude of the deviation increasing with frequency. This deviation can be at least partially compensated for by adjusting the DC tuning voltage provided by voltage source 20 (described below). Note that, as used herein, a phase difference of "approximately 90°" encompasses phase differences which deviate from the ideal 90° due to second order effects.

Providing a fixed phase difference between coil currents prevents the separate tuning of phase difference and gain factor provided by the prior art. However, the present inductor circuit is much more concise and easier to design. Furthermore, with no directional coupler, the entire inductor circuit can be integrated together on a common substrate, using, for example, CMOS transistors and high-Q metal-insulator-metal (MIM) capacitors.

The corresponding DC components of currents $i_1$ and $i_2$ are preferably provided using a voltage source 20 which generates a DC tuning voltage, which is connected to the input of current source 14 via a choke 22 that isolates the RF input signal from the tuning voltage. As noted above, performance effects due to deviation from an ideal 90° phase difference between $i_1$ and $i_2$ can be at least partially compensated for by adjusting the tuning voltage.

Figure 2:
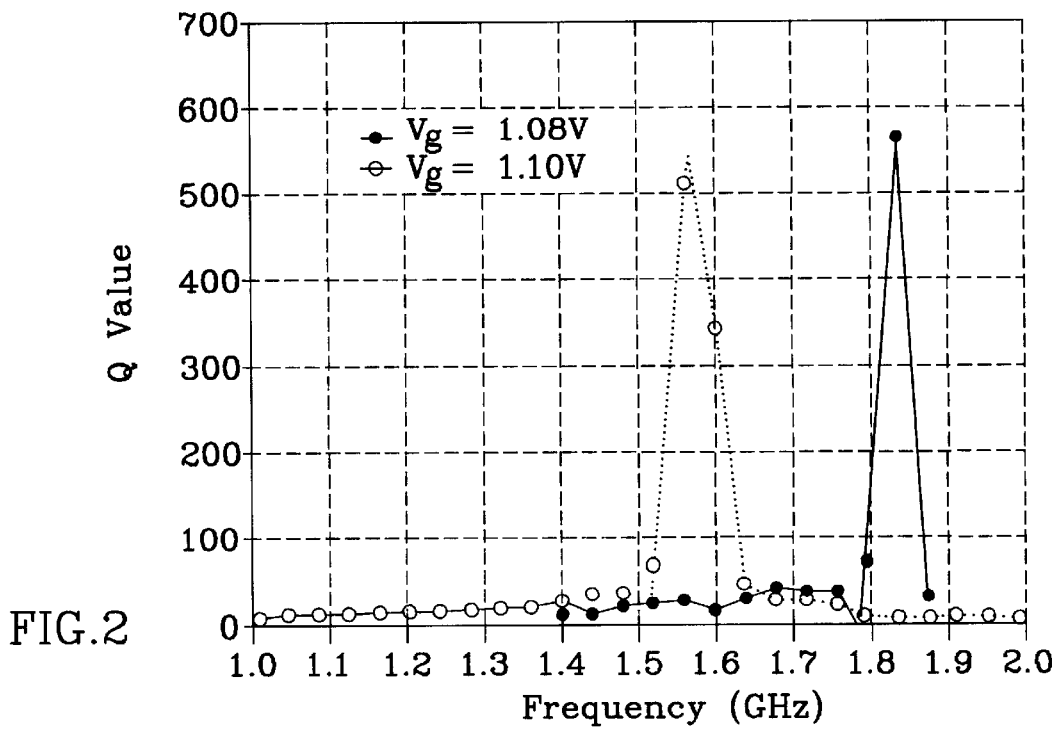
FIG. 2 is an exemplary graph illustrating Q value vs. frequency for an active inductor circuit per the present invention.
Figure 3A:
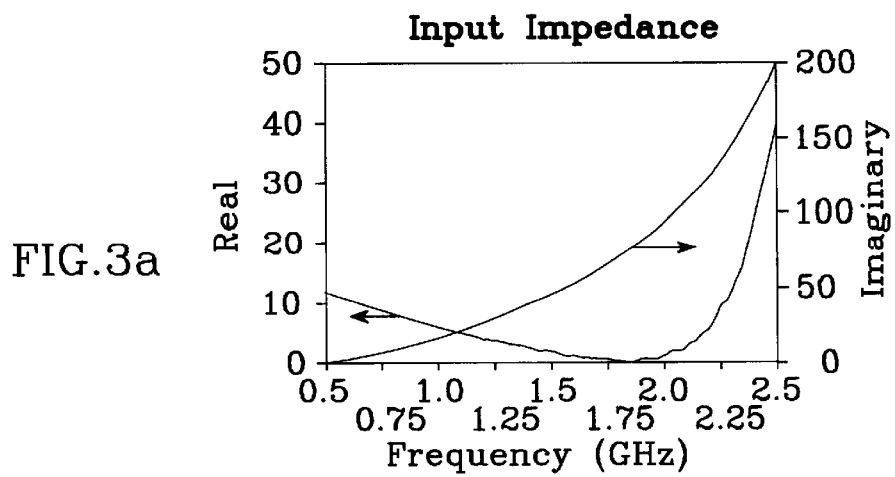
FIGS. 3a and 3b are exemplary graphs illustrating input impedance calculations and reflection coefficient measurements, respectively, for an active inductor circuit per the present invention.
Figure 3B:
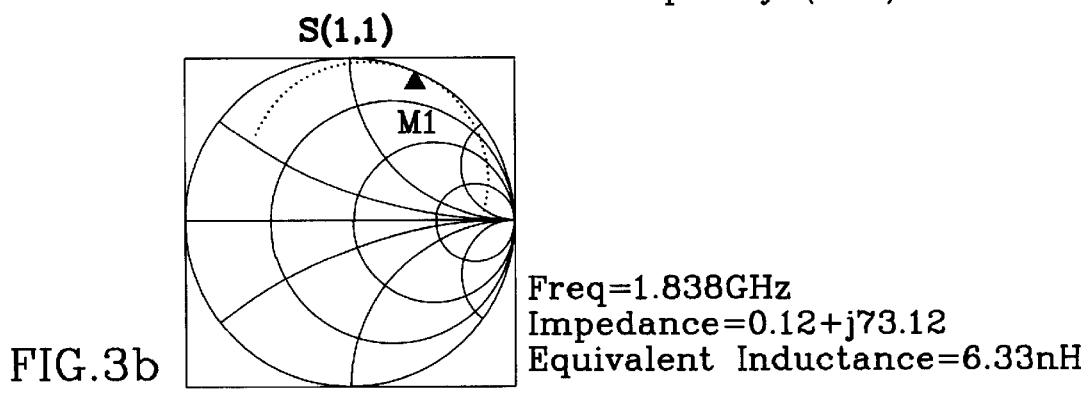

The inductor circuit 10 described above can achieve Q values in excess of 500, as is illustrated in the exemplary graph shown in FIG. 2. As is seen there, the frequency at which the Q value is at a maximum can be adjusted by varying the voltage applied to the gate of M1 by voltage source 20. Exemplary input impedance calculations and reflection coefficient measurements for a high-Q active inductor circuit per the present invention are shown in FIGS. 3a and 3b, respectively; the input impedance plotted in FIG. 3a is calculated from the reflection coefficient measurements plotted in FIG. 3b.

Figure 4:
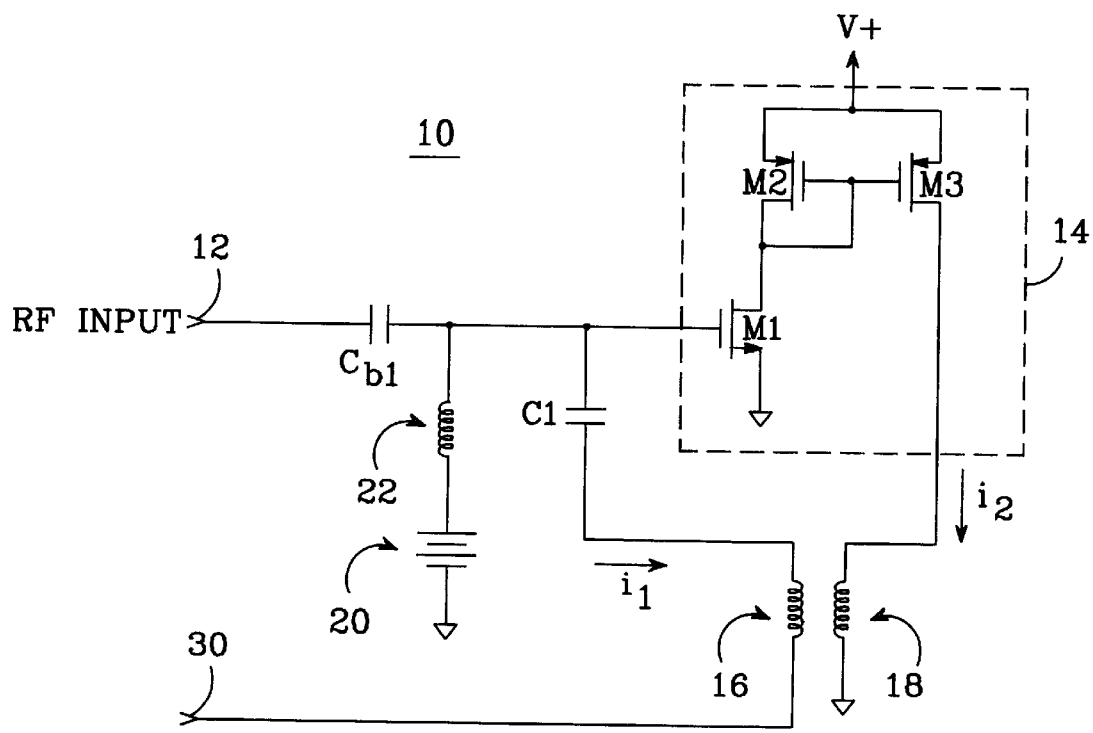
FIG. 4 is a schematic diagram of a two-terminal floating active inductor circuit per the present invention.

The inductor circuit of FIG. 1 might also be employed to provide a two-terminal floating inductor. This is illustrated in FIG. 4. Here, rather than grounding one terminal of primary coil 16, the terminal is brought out as the second port 30 of the active inductor. Additional factors must be considered when using this design. In analyzing the grounded active inductor, the input impedance alone is sufficient to characterize the inductor. A floating active inductor, however, presents some difficulties, in that four scattering parameters are required to characterize it. Unlike the symmetry of the S-matrix of a passive inductor, the active inductor's matrix might not be symmetric, because the power compensation is only one-directional. Also, the active floating inductor is source/load dependent. When a floating inductor is employed in a circuit, the impedance at the second port is variable.

Figure 5:
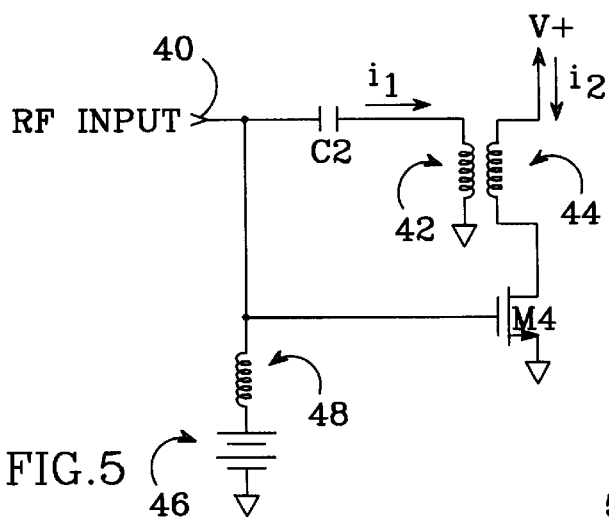
FIG. 5 is a schematic diagram of a one-transistor implementation of a one-terminal active inductor circuit per the present invention.

The 3-transistor current mirror design shown in FIG. 1 may be simplified. As seen in Eq. 4, the necessary current gain provided by the current mirror depends on the operating frequency $\omega$ and the total losses $R_1$ in the primary coil. When the operating frequency is higher and the inductance requirement is moderate, only one transistor may be adequate to provide the necessary gain. This can be considered as a special case in which both $g_{m2}$ and $g_{m3}$ are set equal to unity. Such a circuit is shown in FIG. 5. An RF input signal is applied to an input terminal 40, which provides a current $i_1$ in a primary coil 42 via a capacitor C2. The input signal also drives a transistor M4, which conducts a current $i_2$ through a secondary coil 44 in response. Capacitor C2 introduces a fixed 90° phase difference between currents $i_1$ and $i_2$. A DC tuning voltage is applied to the gate of M4 via a voltage source 46 and a choke 48. The circuit provides a high-Q inductor by sizing M4 such that:

$$g_{m4}=R_1/\omega L_1 M$$

where $g_{m4}$ is the transconductance of transistor M4, $R_1$ is the total loss in the primary coil, $L_1$ is the self-inductance of the primary coil, and M is the mutual inductance between the primary and secondary coils.

This 1-transistor implementation has lower DC power consumption and less noise than the 3-transistor design described above. However, the impedance looking into M4 will be lower than that achieved looking into current source 14. As a result, current $i_2$ may vary more than it would for the 3-transistor design. Nevertheless, it is still possible to achieve an effective resistance of zero over a small frequency range using the one-transistor implementation.

Figure 6:
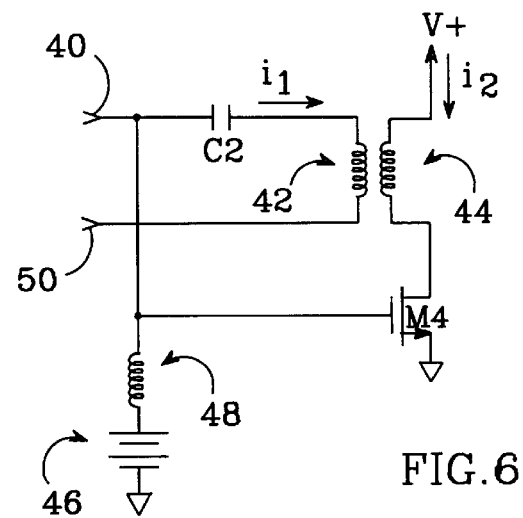
FIG. 6 is a schematic diagram of a one-transistor implementation of a two-terminal floating active inductor circuit per the present invention.

As with the 3-transistor implementation, the 1-transistor design may be employed as a two-terminal floating inductor. One possible implementation is shown in FIG. 6. Here, the second terminal of primary coil 42 is brought out as a second active inductor port 50.

Figure 7A:
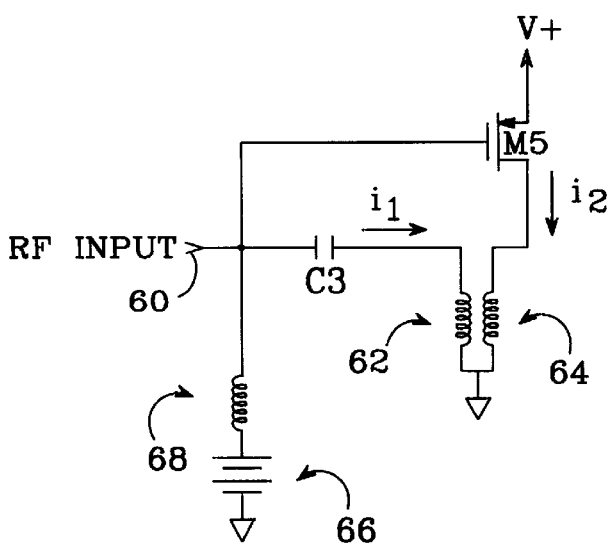
FIG. 7a is a schematic diagram of a PMOS version of a one-transistor implementation of a one-terminal active inductor circuit per the present invention.

FIG. 5 depicted an NMOS version of the 1-transistor design. An equivalent PMOS implementation is shown in FIG. 7a. Here, an RF input is applied to an input terminal 60, which provides a current $i_1$ in a primary coil 62 via a capacitor C3. The current in secondary coil 64 is provided with a PMOS transistor M5, which conducts a current $i_2$ in response to the RF input signal. A voltage source 66 and choke 68 provide a DC tuning voltage to M5's gate as before.

Figure 7B:
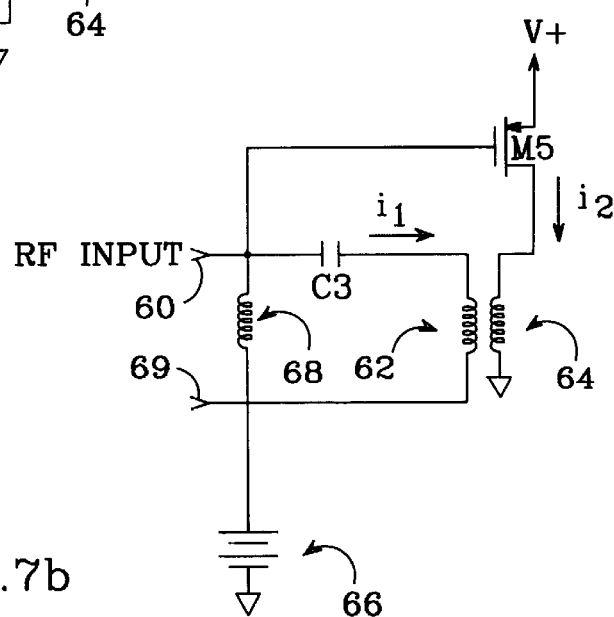
FIG. 7b is a schematic diagram of a PMOS version of a one-transistor implementation of a two-terminal floating active inductor circuit per the present invention.

A PMOS version of a 1-transistor design employed as a two-terminal active inductor is shown in FIG. 7b. Here, the second terminal of primary coil 62 is brought out as a second active inductor port 69.

Note that, while FIG. 1 and FIGS. 4–7 have depicted the use of MOS transistors, the invention can also be realized with bipolar transistors. The use of CMOS components is preferred because of the mainstream low-cost fabrication processes available to form them.

Figure 9:
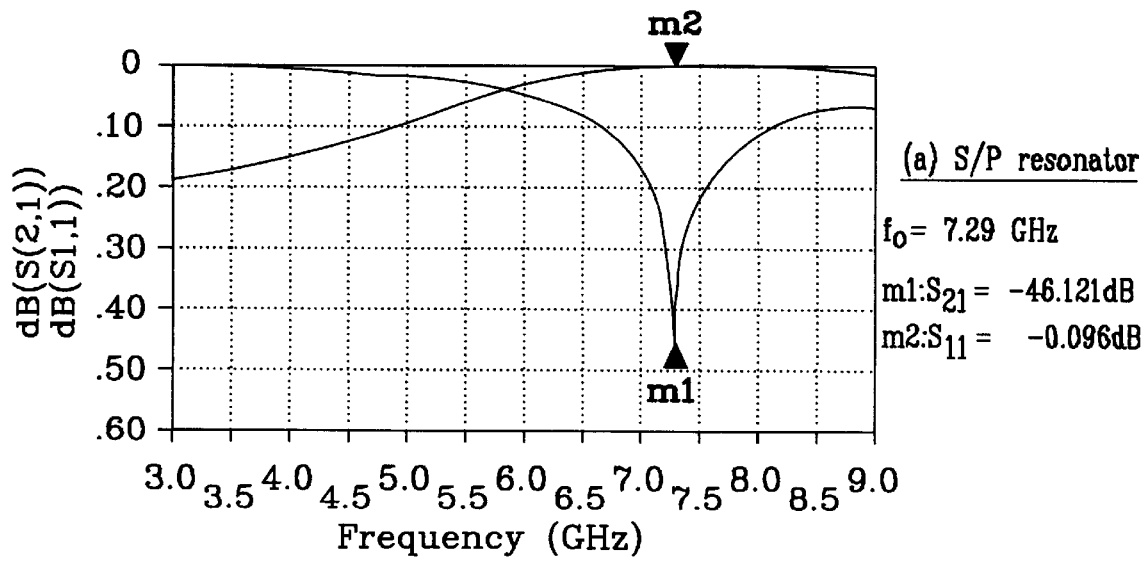
FIGS. 9a and 9b are exemplary graphs depicting the frequency responses of an S/P and a P/S resonator circuit, respectively, each of which employs an active inductor circuit per the present invention.
Figure 9:
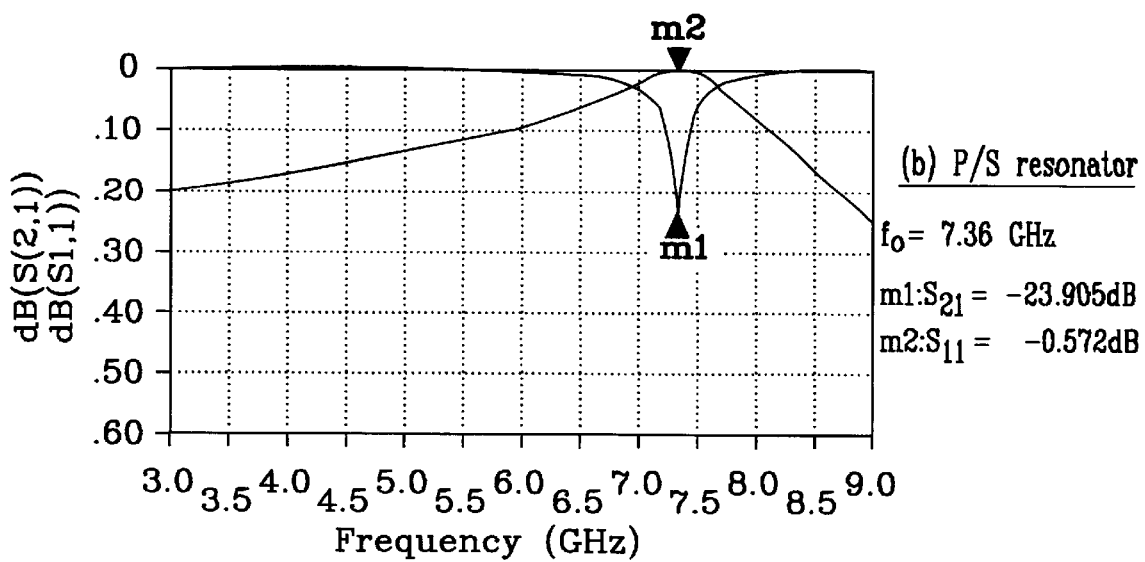

Inductors are often connected with capacitors to implement resonators. The four possible resonator types, S/S, S/P, P/S, and P/P, are shown in FIGS. 8a–8d respectively. In each of these schematics, the inductor in the dashed box represents an on-chip active inductor as described above, either floating (as in FIGS. 8a and 8b) or grounded (as in FIGS. 8c and 8d). Simulation results with two of the resonator configurations—the S/P resonator of FIG. 8b and the P/S resonator of FIG. 8c—are shown in FIGS. 9a and 9b, respectively. As seen in these exemplary graphs, at resonance, the applied signal is almost totally reflected and no signal is received at port 2. Around the resonating frequency, the frequency response is almost identical to that of an ideal resonator, with a Q greater than 500 calculated from the 3-dB bandwidth. Away from the resonant frequency, the high-Q condition of Eq. 4 is no longer satisfied, and the response deviates from the ideal.

For wireless communication systems, bandpass filters (BPFs) are essential for channel selection at either the transmitter, the receiver, or both. As operating frequencies become higher and the spectrum becomes more crowded, conventional BPFs become more and more difficult to integrate with other on-chip components. Butterworth and Chebyshev prototypes might provide a suitable approach, but their natural roll-off characteristics cannot provide sharp outband rejection. An elliptical approach can provide higher outband rejection, but the inband insertion loss and the transmission poles are highly sensitive to the inductances and the Q-values.

The present invention provides a solution which overcomes many of these problems. As noted above, the present active inductors are integrated with on-chip capacitors such as MIM capacitors to implement high-Q resonating tanks. By arranging these tanks, a desired BPF topology is realized, which can be fully integrated on a common substrate. An exemplary simplified schematic of an active BPF is shown in FIG. 10; each dashed box represents an active inductor as described herein.

Figure 11:
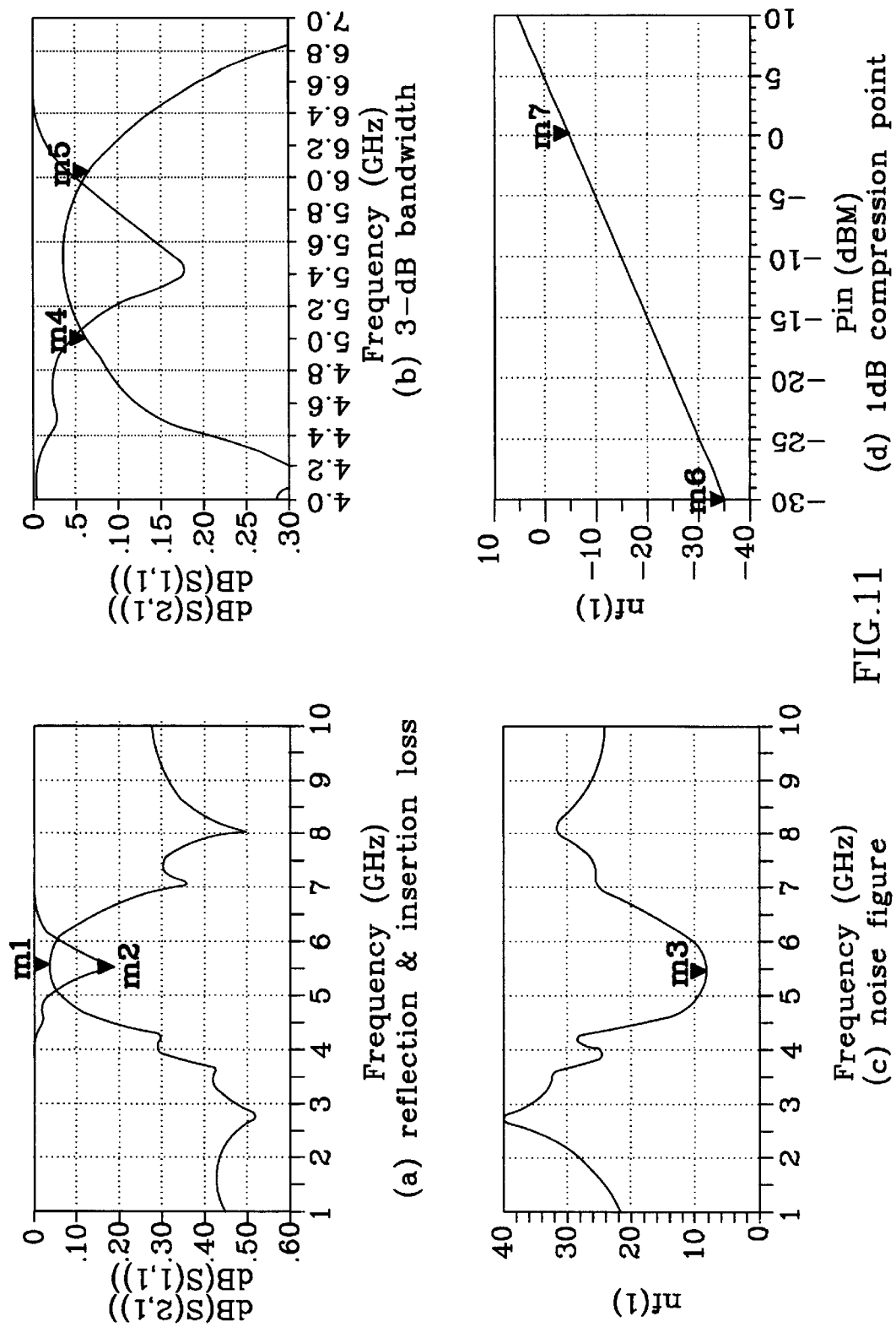
FIGS. 11a–11d are exemplary graphs depicting reflection and insertion loss, 3-dB bandwidth, noise figure, and 1 dB compression point, respectively, for a bandpass filter which employs active inductor circuits per the present invention.

The parallel-connected $L_1$ and $C_1$ are open-circuited at the resonating frequency, while the serial-connected $L_3$ and $C_3$ are short-circuited at resonating. The five capacitors in the serial signal path play two roles: first, they serve as DC isolation capacitors for each active resonator. Second, they can enhance the lower frequency rejection of the BPF. Simulated characteristics of an exemplary active BPF, with a center frequency at 5.4 GHz, are shown in FIGS. 11a–11d. $L_1/C_1$ and $L_2/C_2$ provide the two transmission poles at 7.5 and 8 GHz, while $L_3/C_3$ to $L_6/C_6$ provides the 3 transmission poles at 2.7, 3.6 and 4.4 GHz. FIG. 11a shows the in-band reflection and insertion loss at the center frequency as −18.75 and −4.7 dB, respectively. Expanding the spectrum of FIG. 11a, the 3-dB bandwidth can be seen in FIG. 11b as 1 GHz. FIG. 11c shows the input-referred noise figure as 7.99 dB at the center frequency, and in FIG. 11d, the 1 dB compression point is estimated at 1 dBm. Between the crowded 0.9 to 2.4 GHz bands, the rejection is enhanced to be lower than −42dB.

A BPF such as that illustrated in FIG. 10 is suitably placed at the receiver front end as an image-rejection filter, between the low-noise amplifier (LNA) and the mixer. For passive filters, the noise figure is determined by the loss due to the filter itself. In this active counterpart, the added active drive currents increase the noise figure by 3.29 dB, which might be detrimental to the weak received signal. However, further examination suggests that by increasing the output impedance (higher than 50 Ω termination) of the LNA, the gain of the first stage will also be increased, which results in a lower receiver noise figure. This higher termination can also increase the Q of the resonators, which ensures a sharper outband rejection.

Active inductors in accordance with the present invention are monolithically integrated, and can be realized using mainstream fabrication methods, including CMOS or bipolar methods. This capability makes possible high performance on-chip RF filters, which in turn enables the fabrication of a complete RF system on a chip.

Plan and corresponding cross-sectional views of an exemplary active inductor circuit as described herein are shown in FIGS. 12a and 12b, respectively. One or more transistors 70 are fabricated on a substrate 72, with connections to the transistor terminals effected with a first metal layer 74, which is then covered with a dielectric layer 76. The inductor coils are preferably fabricated with one coil above the other with respect to substrate 72. One coil 77 is fabricated on dielectric layer 76 with a second metal layer 78, which is also used to form the bottom plate 80 of a capacitor 82. Another dielectric layer 83 is deposited on second metal layer 78. The capacitor is completed by patterning and etching an opening through dielectric layer 83 above bottom plate 80, and then depositing the capacitor's dielectric layer 84 and top plate metal 86 in the opening. A third layer of metal 88 is deposited, patterned and etched on top of a dielectric layer 90 to form the second inductor coil 92. Interconnections between the components are effected with metal layers 74, 78 and 88 and vias 94. Note that though only three metal layers are described here, actual integrated circuits employing the present active inductor circuit might include additional metal layers, and additional material layers as well.

The structures shown in FIGS. 12a and 12b may be fabricated using conventional photolithographic techniques. For example, the transistors are preferably CMOS, and are fabricated with the capacitor plates and inductor coils on a silicon substrate. However, the invention is not limited to a CMOS implementation or a silicon substrate; the active inductor circuit might also employ bipolar transistors, and/or be built on a substrate other than silicon.

Note that the device structure shown in FIGS. 12a and 12b is merely exemplary. For example, the 3-transistor implementation described above would require that 2 more transistors be fabricated for every active inductor on the chip.

While particular embodiments of the invention have been shown and described, numerous variations and alternate embodiments will occur to those skilled in the art. Accordingly, it is intended that the invention be limited only in terms of the appended claims.

We claim:

1. A monolithic active inductor circuit, comprising:
   an input terminal which receives an RF input signal,
   a primary coil which carries a first current, said first current having an AC component which varies with said input signal,
   a secondary coil located in close proximity to said primary coil such that a magnetic field induced by a current in said secondary coil is coupled to said primary coil, and
   an on-chip current source which provides a second current in said secondary coil, said second current having an AC component which varies with said input signal, said inductor circuit arranged such that there is a fixed phase difference of approximately 90° between the AC components of said first and second currents and such that the magnetic field induced by said second current compensates for energy that would otherwise be dissipated by said primary coil,
   said primary coil, said secondary coil, and said current source integrated together on a common substrate.

2. The active inductor circuit of claim 1, wherein the input impedance $Z_{in}$ at said input terminal is given by:

$$Z_{in} = R_{eff} + j\omega L_{eff}$$

where $R_{eff}$ and $L_{eff}$ are the effective resistance and inductance of the inductor circuit, respectively, and wherein said inductor circuit is arranged such that the ratio of said second current to said first current is selected to cancel the real part of $Z_{in}$ so that $Z_{in} = j\omega L_{eff}$.

3. The active inductor circuit of claim 1, further comprising a capacitor connected between said input terminal and said primary coil which phase shifts said input signal by approximately 90° prior to its being applied to said primary coil, and wherein said current source is arranged such that the AC component of said second current is approximately 180° out-of-phase with said input signal, thereby providing said phase difference of approximately 90° between the AC components of said first and second currents.

4. The active inductor circuit of claim 1, wherein said current source is a transistor which conducts said second current in response to a drive signal comprising said RF input signal and a DC tuning voltage.

5. The active inductor circuit of claim 4, further comprising a DC voltage source which provides said DC tuning voltage.

6. The active inductor circuit of claim 5, further comprising a choke connected between said DC voltage source and said RF input signal to isolate said input signal from said DC tuning voltage.

7. The active inductor circuit of claim 4, wherein said transistor is sized such that:

$$g_m = R_1/\omega L_1 M$$

wherein $g_m$ is the transconductance of the transistor, $R_1$ is the total loss in the primary coil, $L_1$ is the self-inductance of the primary coil, and M is the mutual inductance between the primary and secondary coils.

8. The active inductor circuit of claim 1, wherein said current source is a current mirror circuit which provides said second current in response to a drive signal comprising said RF input signal and a DC tuning voltage.

9. The active inductor circuit of claim 8, further comprising a DC voltage source which provides said DC tuning voltage.

10. The active inductor circuit of claim 9, further comprising a choke connected between said DC voltage source and said RF input signal to isolate said input signal from said DC tuning voltage.

11. The active inductor circuit of claim 8, wherein said current mirror comprises first, second and third transistors, each of which has a current circuit and a control input, said first transistor connected to receive said drive signal at its control input and to conduct a third current through its current circuit in response, and said second and third transistors connected to mirror said third current from said first transistor to the current circuit of said third transistor, said third transistor conducting said second current through its current circuit, and wherein said first, second and third transistors are sized such that:

$$(g_m g_{m3})/g_{m2} = R_1/\omega L_1 M$$

wherein $g_{m1}$, $g_{m2}$ and $g_{m3}$ are the transconductances of the first, second and third transistors, respectively, $R_1$ is the total loss in the primary coil, $L_1$ is the self-inductance of the primary coil, and M is the mutual inductance between the primary and secondary coils.

12. The active inductor circuit of claim 1, wherein said current source is implemented on said common substrate with CMOS components.

13. The active inductor of claim 12, wherein said primary and secondary coils are arranged such that one coil is above the other coil with respect to said common substrate.

14. The active inductor of claim 1, wherein one side of said primary coil is grounded such that said active inductor circuit provides a one-terminal grounded active inductor.

15. The active inductor of claim 1, further comprising a second input terminal connected to one side of said primary coil such that said active inductor circuit provides a two-terminal floating active inductor.

16. A monolithic active inductor circuit, comprising:
an input terminal which receives an RF input signal,
a primary coil which carries a first current, said first current having an AC component which varies with said input signal,
a capacitor connected between said input terminal and said primary coil which phase shifts said input signal by approximately 90° prior to its being applied to said primary coil,
a secondary coil which carries a second current and is located in close proximity to said primary coil such that a magnetic field induced by a current in said secondary coil is coupled to said primary coil, and
an on-chip current source comprising a transistor which conducts said second current in response to a drive signal comprising said RF input signal and a DC tuning voltage, said second current having an AC component which varies with and is 180° out-of-phase with said input signal,
a DC voltage source which provides said DC tuning voltage, and
a choke connected between said DC voltage source and said RF input signal to isolate said input signal from said DC tuning voltage,
said active inductor circuit arranged such that the magnetic field induced by said second current compensates for energy that would otherwise be dissipated by said primary coil,
said primary coil, said secondary coil, and said current source integrated together on a common substrate.

17. The monolithic active inductor circuit of claim 16, wherein the input impedance $Z_{in}$ at said input terminal is given by:

$$Z_{in} = R_{eff} + j\omega L_{eff}$$

where $R_{eff}$ and $L_{eff}$ are the effective resistance and inductance of the inductor circuit, respectively, and wherein said active inductor circuit is arranged such that the ratio of said second current to said first current is selected to cancel the real part of $Z_{in}$ so that $Z_{in} = j\omega L_{eff}$.

18. The monolithic active inductor circuit of claim 16, wherein said current source is a transistor having a current circuit and a control input, said transistor connected to receive said drive signal at said control input and to conduct said second current through said current circuit in response to said drive signal,
said transistor sized such that:

$$g_m = R_1/\omega L_1 M$$

wherein $g_m$ is the transconductance of the transistor, $R_1$ is the total loss in the primary coil, $L_1$ is the self-inductance of the primary coil, and M is the mutual inductance between the primary and secondary coils.

19. The monolithic active inductor circuit of claim 16, wherein said current source is a current mirror circuit comprising first, second and third transistors, each of which has a current circuit and a control input, said first transistor connected to receive said drive signal at its control input and to conduct a third current through its current circuit in response, and said second and third transistors connected to mirror said third current from said first transistor to the current circuit of said third transistor, said third transistor conducting said second current through its current circuit, and wherein said first, second and third transistors are sized such that:

$$(g_m g_{m3})/g_{m2} = R_1/\omega L_1$$

wherein $g_{m1}$, $g_{m2}$ and $g_{m3}$ are the transconductances of the first, second and third transistors, respectively, $R_1$ is the total loss in the primary coil, $L_1$ is the self-inductance of the primary coil, and M is the mutual inductance between the primary and secondary coils.

20. The monolithic active inductor circuit of claim 16, wherein said current source is implemented on said common substrate with CMOS components.

21. The monolithic active inductor of claim 16, wherein said primary and secondary coils are arranged such that one coil is above the other coil with respect to said common substrate.

22. The monolithic active inductor of claim 16, wherein one side of said primary coil is grounded such that said active inductor circuit provides a one-terminal grounded active inductor.

23. The monolithic active inductor of claim 16, further comprising a second input terminal connected to one side of said primary coil such that said active inductor circuit provides a two-terminal floating active inductor.

24. A bandpass filter, comprising:
a plurality of capacitors, and
a plurality of inductors, said capacitors and inductors interconnected to form a bandpass filter, each of said inductors comprising a monolithic active inductor circuit which comprises:
an input terminal which receives an RF input signal,
a primary coil which carries a first current, said first current having an AC component which varies with said input signal,
a secondary coil located in close proximity to said primary coil such that a magnetic field induced by a current in said secondary coil is coupled to said primary coil, and
a current source which provides a second current in said secondary coil, said second current having an AC component which varies with said input signal, said active inductor circuit arranged such that there is a phase difference of approximately 90° between the AC components of said first and second currents and such that the magnetic field induced by said second current compensates for energy that would otherwise be dissipated by said primary coil, said primary coil, said secondary coil, and said current source integrated together on a common substrate.

25. The bandpass filter of claim 24, wherein at least one of said plurality of inductors is connected in a shunt configuration with one side of said primary coil grounded such that said active inductor circuit provides a one-terminal grounded active inductor.

26. The bandpass filter of claim 24, wherein at least one of said plurality of inductors is connected in series with other ones of said inductors and capacitors, each of said in-series inductors further comprising a second input terminal connected to one side of said primary coil such that said active inductor circuit provides a two-terminal floating active inductor.

27. The bandpass filter of claim 24, wherein each of said inductors and capacitors are integrated together on a common substrate.

28. The bandpass filter of claim 24, wherein each of said current sources are implemented on said common substrate with CMOS components.

* * * * *